US008935559B2

(12) United States Patent
Poulton et al.

(10) Patent No.: US 8,935,559 B2
(45) Date of Patent: Jan. 13, 2015

(54) SYSTEM AND METHOD FOR REDUCING CROSSTALK IN ON-CHIP NETWORKS USING A CONTRAFLOW INTERCONNECT AND OFFSET REPEATERS

(75) Inventors: John W. Poulton, Chapel Hill, NC (US); Robert Palmer, Carrboro, NC (US); Thomas Hastings Greer, III, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 148 days.

(21) Appl. No.: 13/360,571

(22) Filed: Jan. 27, 2012

(65) Prior Publication Data

US 2013/0198555 A1    Aug. 1, 2013

(51) Int. Cl.
*G06F 1/04* (2006.01)
*G06F 17/50* (2006.01)
*H04L 25/08* (2006.01)

(52) U.S. Cl.
CPC ............ *G06F 17/5077* (2013.01); *H04L 25/085* (2013.01)
USPC .......................................................... 713/600

(58) Field of Classification Search
CPC ............ H03K 19/00346; H04L 25/085; G06F 17/5077
USPC .......................................................... 713/600
See application file for complete search history.

(56) References Cited

U.S. PATENT DOCUMENTS

| | | | | |
|---|---|---|---|---|
| 6,389,581 | B1 * | 5/2002 | Muddu et al. | 716/114 |
| 6,765,413 | B2 * | 7/2004 | Nakase | 326/86 |
| 2002/0112220 | A1 * | 8/2002 | Miller | 716/10 |
| 2003/0117184 | A1 * | 6/2003 | Fecteau et al. | 327/94 |
| 2003/0117301 | A1 * | 6/2003 | Savaria et al. | 341/55 |
| 2012/0210040 | A1 * | 8/2012 | Masleid et al. | 710/317 |

\* cited by examiner

*Primary Examiner* — Thomas Lee
*Assistant Examiner* — Danny Chan
(74) *Attorney, Agent, or Firm* — Patterson & Sheridan, LLP (57) ABSTRACT

A data connector includes two different sets of wires that transport data between components of a computer system. A first set of wires transports data from a first component to a second component. A second set of wires transports data from the second component to the first component. The first set of wires is interlaced with the second set of wires so that each wire in the data connector transports data in the opposite direction of one or more neighboring wires.

17 Claims, 7 Drawing Sheets

SYSTEM AND METHOD FOR REDUCING CROSSTALK IN ON-CHIP NETWORKS USING A CONTRAFLOW INTERCONNECT AND OFFSET REPEATERS

BACKGROUND OF THE INVENTION

1. Field of the Invention

The present invention generally relates to computer hardware and more specifically to a system and method for reducing crosstalk in on-chip networks.

2. Description of the Related Art

A modern computer chip, such as a central processing unit (CPU) or a graphics processing unit (GPU), generally includes a communication network that couples each chip component with other chip components and allows data to be transmitted between those various components. The communication network generally includes a set of parallel wires capable of transmitting data simultaneously.

It is highly desirable for on-chip networks to take up as little area as possible, and so the wires that make up the communication network are typically packed together as closely as allowed by process design rules. The interaction between neighboring wires, specifically the coupling capacitance between neighboring wires, introduces "cross-talk," a phenomenon that distorts both the timing information and logical voltage levels of data signals traversing the network. This phenomenon is cumulative, and therefore becomes progressively worse across greater distances. At high data rates, this effect severely limits the distance over which data can be transmitted.

Cross-talk can be effectively canceled by shielding the wires that compose the communication network. However, this technique may increase the area of the communication network greatly.

Accordingly, what is needed in the art is a communication network that is more robust against the effects of cross-talk while consuming minimal on-chip area.

SUMMARY OF THE INVENTION

Embodiments of the invention include a system for transmitting data between components within an integrated circuit (IC), including a first IC component coupled to a first set of data connections and configured to transmit a first data signal across the first set of data connections and a second IC component coupled to a second set of data connections and configured to transmit a second data signal across the second set of data connections. The system further includes a data connector that includes the first and second sets of data connections and is configured to transport the first data signal to the second IC component across the first set of data connections and transport the second data signal to the first IC component across the second set of data connections, where the first set of data connections is interlaced with the second set of data connections such that each data connection in the first and second sets of data connections transmits data signals in a direction opposite of a direction one or more adjacent data connections transmit data signals.

One advantage of the invention is that crosstalk between neighboring wires is minimized, thereby improving the throughput of data transmissions between chip components. The distance across which data can reliably be transmitted may also be increased. In addition, the use of shielding may be avoided, thereby minimizing the area consumed by the contraflow interconnect.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
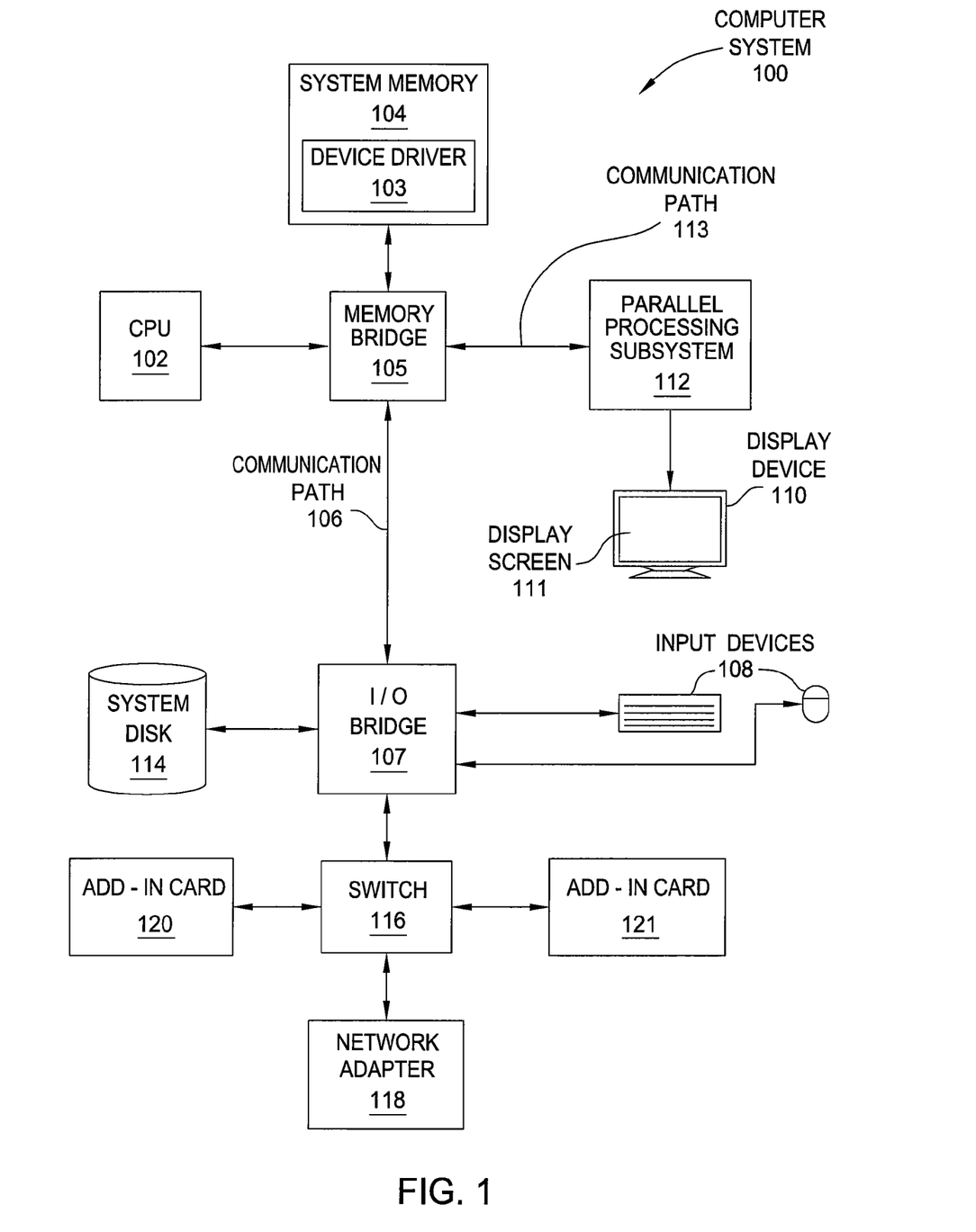
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 that includes a device driver 103. CPU 102 and system memory 104 communicate via an interconnection path that may include a memory bridge 105. Memory bridge 105, which may be, e.g., a Northbridge chip, is connected via a bus or other communication path 106 (e.g., a HyperTransport link) to an input/output (I/O) bridge 107. I/O bridge 107, which may be, e.g., a Southbridge chip, receives user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a peripheral component interconnect (PCI) express, Accelerated Graphics Port (AGP), or HyperTransport link); in one embodiment parallel processing subsystem 112 is a graphics subsystem that delivers pixels to a display device 110 (e.g., a conventional cathode ray tube (CRT) or liquid crystal display (LCD) based monitor). A system disk 114 is also connected to I/O bridge 107. A switch 116 provides connections between I/O bridge 107 and other components such as a network adapter 118 and various add-in cards 120 and 121. Other components (not explicitly shown), including universal serial bus (USB) or other port connections, compact disc (CD) drives, digital video disc (DVD) drives, film recording devices, and the like, may also be connected to I/O bridge 107. Communication paths interconnecting the various components in FIG. 1 may be implemented using any suitable protocols, such as PCI, PCI Express (PCIe), AGP, HyperTransport, or any other bus or point-to-point communication protocol(s), and connections between different devices may use different protocols as is known in the art.

As described in greater detail below in conjunction with FIGS. 3A-4, a "contraflow interconnect" may couple together components that reside on a given chip within computer system 100. The contraflow interconnect includes two different sets of wires that transport data between different on-chip components. The first set of wires transports data from a first component to a second component. The second set of wires transports data from the second component to the first component. The first set of wires is interlaced with the second set of wires so that each wire in the contraflow interconnect transports data in the opposite direction of one or more neighboring wires. As discussed below in conjunction with FIG. 2, the contraflow interconnect may also be used to transport data between chip components within the parallel processing subsystem 112 or the CPU 102. In general, the contraflow interconnect described below may be used to transport data between any of the various components discussed herein.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip. Large embodiments may include two or more CPUs 102 and two or more parallel processing systems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Figure 2:
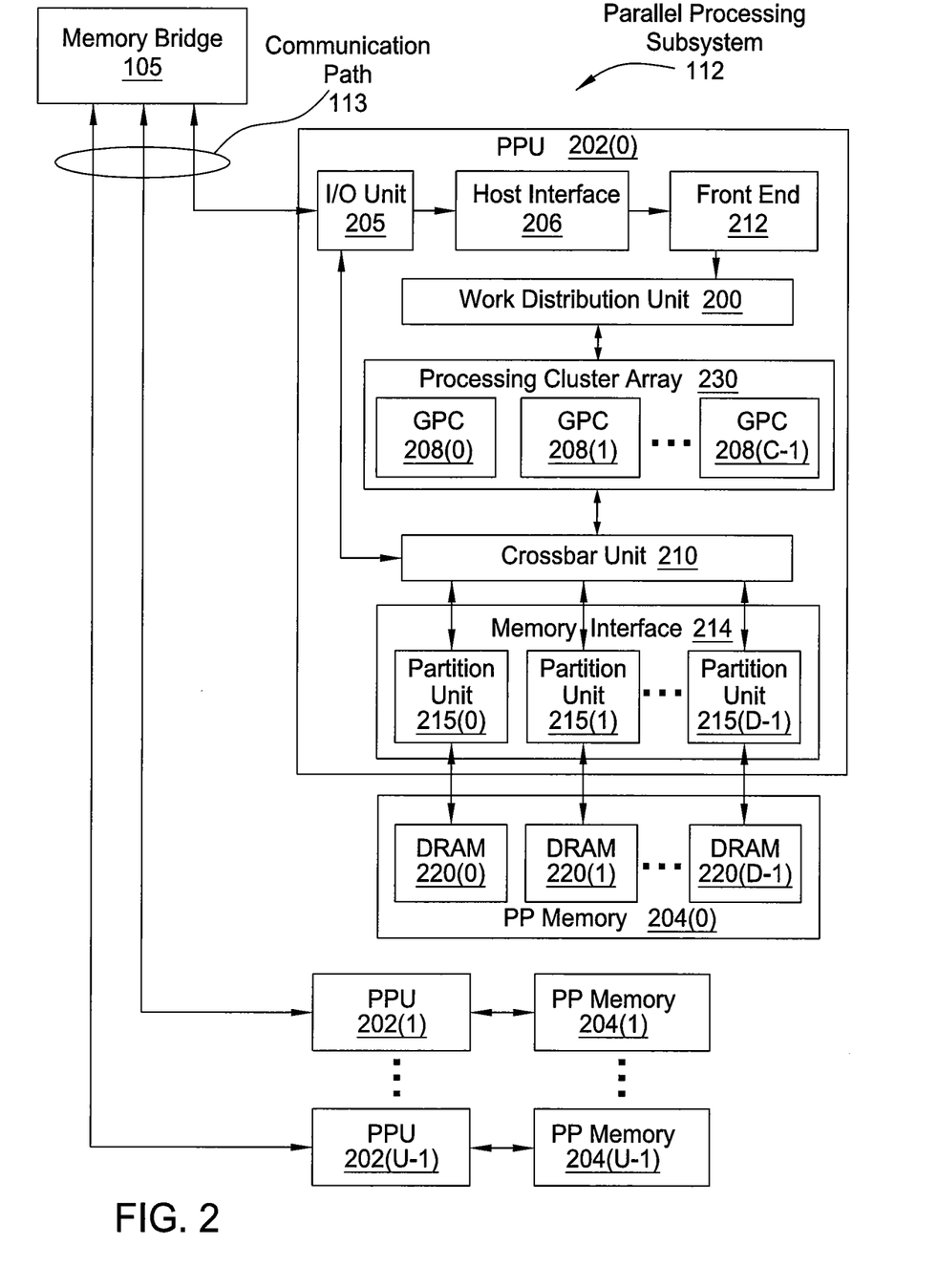
FIG. 2 is a block diagram of a parallel processing subsystem for the computer system of FIG. 1, according to one embodiment of the present invention.

FIG. 2 illustrates a parallel processing subsystem 112, according to one embodiment of the present invention. As shown, parallel processing subsystem 112 includes one or more parallel processing units (PPUs) 202, each of which is coupled to a local parallel processing (PP) memory 204. In general, a parallel processing subsystem includes a number U of PPUs, where U≥1. (Herein, multiple instances of like objects are denoted with reference numbers identifying the object and parenthetical numbers identifying the instance where needed.) PPUs 202 and parallel processing memories 204 may be implemented using one or more integrated circuit devices, such as programmable processors, application specific integrated circuits (ASICs), or memory devices, or in any other technically feasible fashion.

Referring again to FIG. 1, in some embodiments, some or all of PPUs 202 in parallel processing subsystem 112 are graphics processors with rendering pipelines that can be configured to perform various tasks related to generating pixel data from graphics data supplied by CPU 102 and/or system memory 104 via memory bridge 105 and bus 113, interacting with local parallel processing memory 204 (which can be used as graphics memory including, e.g., a conventional frame buffer) to store and update pixel data, delivering pixel data to display device 110, and the like. In some embodiments, parallel processing subsystem 112 may include one or more PPUs 202 that operate as graphics processors and one or more other PPUs 202 that are used for general-purpose computations. The PPUs may be identical or different, and each PPU may have its own dedicated parallel processing memory device(s) or no dedicated parallel processing memory device(s). One or more PPUs 202 may output data to display device 110 or each PPU 202 may output data to one or more display devices 110.

In operation, CPU 102 is the master processor of computer system 100, controlling and coordinating operations of other system components. In particular, CPU 102 issues commands that control the operation of PPUs 202. In some embodiments, CPU 102 writes a stream of commands for each PPU 202 to a pushbuffer (not explicitly shown in either FIG. 1 or FIG. 2) that may be located in system memory 104, parallel processing memory 204, or another storage location accessible to both CPU 102 and PPU 202. PPU 202 reads the command stream from the pushbuffer and then executes commands asynchronously relative to the operation of CPU 102.

Referring back now to FIG. 2, each PPU 202 includes an I/O unit 205 that communicates with the rest of computer system 100 via communication path 113, which connects to memory bridge 105 (or, in one alternative embodiment, directly to CPU 102). The connection of PPU 202 to the rest of computer system 100 may also be varied. In some embodiments, parallel processing subsystem 112 is implemented as an add-in card that can be inserted into an expansion slot of computer system 100. In other embodiments, a PPU 202 can be integrated on a single chip with a bus bridge, such as memory bridge 105 or I/O bridge 107. In still other embodiments, some or all elements of PPU 202 may be integrated on a single chip with CPU 102.

In one embodiment, communication path 113 is a PCIe link, in which dedicated lanes are allocated to each PPU 202, as is known in the art. Other communication paths may also be used. An I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to parallel processing memory 204) may be directed to a memory crossbar unit 210. Host interface 206 reads each pushbuffer and outputs the work specified by the pushbuffer to a front end 212.

Each PPU 202 advantageously implements a highly parallel processing architecture. As shown in detail, PPU 202(0) includes a processing cluster array 230 that includes a number C of general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. For example, in a graphics application, a first set of GPCs 208 may be allocated to perform tessellation operations and to produce primitive topologies for patches, and a second set of GPCs 208 may be allocated to perform tessellation shading to evaluate patch parameters for the primitive topologies and to determine vertex positions and other per-vertex attributes. The allocation of GPCs 208 may vary dependent on the workload arising for each type of program or computation.

GPCs 208 receive processing tasks to be executed via a work distribution unit 200, which receives commands defining processing tasks from front end unit 212. Processing tasks include indices of data to be processed, e.g., surface (patch) data, primitive data, vertex data, and/or pixel data, as well as state parameters and commands defining how the data is to be processed (e.g., what program is to be executed). Work distribution unit 200 may be configured to fetch the indices corresponding to the tasks, or work distribution unit 200 may receive the indices from front end 212. Front end 212 ensures that GPCs 208 are configured to a valid state before the processing specified by the pushbuffers is initiated.

When PPU 202 is used for graphics processing, for example, the processing workload for each patch is divided into approximately equal sized tasks to enable distribution of the tessellation processing to multiple GPCs 208. A work distribution unit 200 may be configured to produce tasks at a frequency capable of providing tasks to multiple GPCs 208 for processing. By contrast, in conventional systems, processing is typically performed by a single processing engine, while the other processing engines remain idle, waiting for the single processing engine to complete its tasks before beginning their processing tasks. In some embodiments of the present invention, portions of GPCs 208 are configured to perform different types of processing. For example a first portion may be configured to perform vertex shading and topology generation, a second portion may be configured to perform tessellation and geometry shading, and a third portion may be configured to perform pixel shading in screen space to produce a rendered image. Intermediate data produced by GPCs 208 may be stored in buffers to allow the intermediate data to be transmitted between GPCs 208 for further processing.

Memory interface 214 includes a number D of partition units 215 that are each directly coupled to a portion of parallel processing memory 204, where D≥1. As shown, the number of partition units 215 generally equals the number of DRAM 220. In other embodiments, the number of partition units 215 may not equal the number of memory devices. Persons skilled in the art will appreciate that dynamic random access memories (DRAMs) 220 may be replaced with other suitable storage devices and can be of generally conventional design. A detailed description is therefore omitted. Render targets, such as frame buffers or texture maps may be stored across DRAMs 220, allowing partition units 215 to write portions of each render target in parallel to efficiently use the available bandwidth of parallel processing memory 204.

Any one of GPCs 208 may process data to be written to any of the DRAMs 220 within parallel processing memory 204. Crossbar unit 210 is configured to route the output of each GPC 208 to the input of any partition unit 215 or to another GPC 208 for further processing. GPCs 208 communicate with memory interface 214 through crossbar unit 210 to read from or write to various external memory devices. In one embodiment, crossbar unit 210 has a connection to memory interface 214 to communicate with I/O unit 205, as well as a connection to local parallel processing memory 204, thereby enabling the processing cores within the different GPCs 208 to communicate with system memory 104 or other memory that is not local to PPU 202. In the embodiment shown in FIG. 2, crossbar unit 210 is directly connected with I/O unit 205. Crossbar unit 210 may use virtual channels to separate traffic streams between the GPCs 208 and partition units 215.

Again, GPCs 208 can be programmed to execute processing tasks relating to a wide variety of applications, including but not limited to, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel shader programs), and so on. PPUs 202 may transfer data from system memory 104 and/or local parallel processing memories 204 into internal (on-chip) memory, process the data, and write result data back to system memory 104 and/or local parallel processing memories 204, where such data can be accessed by other system components, including CPU 102 or another parallel processing subsystem 112.

A PPU 202 may be provided with any amount of local parallel processing memory 204, including no local memory, and may use local memory and system memory in any combination. For instance, a PPU 202 can be a graphics processor in a unified memory architecture (UMA) embodiment. In such embodiments, little or no dedicated graphics (parallel processing) memory would be provided, and PPU 202 would use system memory exclusively or almost exclusively. In UMA embodiments, a PPU 202 may be integrated into a bridge chip or processor chip or provided as a discrete chip with a high-speed link (e.g., PCIe) connecting the PPU 202 to system memory via a bridge chip or other communication means.

As noted above, any number of PPUs 202 can be included in a parallel processing subsystem 112. For instance, multiple PPUs 202 can be provided on a single add-in card, or multiple add-in cards can be connected to communication path 113, or one or more of PPUs 202 can be integrated into a bridge chip. PPUs 202 in a multi-PPU system may be identical to or different from one another. For instance, different PPUs 202 might have different numbers of processing cores, different amounts of local parallel processing memory, and so on. Where multiple PPUs 202 are present, those PPUs may be operated in parallel to process data at a higher throughput than is possible with a single PPU 202. Systems incorporating one or more PPUs 202 may be implemented in a variety of configurations and form factors, including desktop, laptop, or handheld personal computers, servers, workstations, game consoles, embedded systems, and the like.

Contraflow Interconnect

FIG. 3A-3D are conceptual diagrams that each illustrates a computer system configured to implement an embodiment of the contraflow interconnect mentioned above in conjunction with FIGS. 1 and 2. Persons skilled in the art will recognize that the different embodiments of the contraflow interconnect, described below, may be combined with one another in any technically feasible fashion, and that all such combinations fall within the scope of the present invention.

Figure 3A:
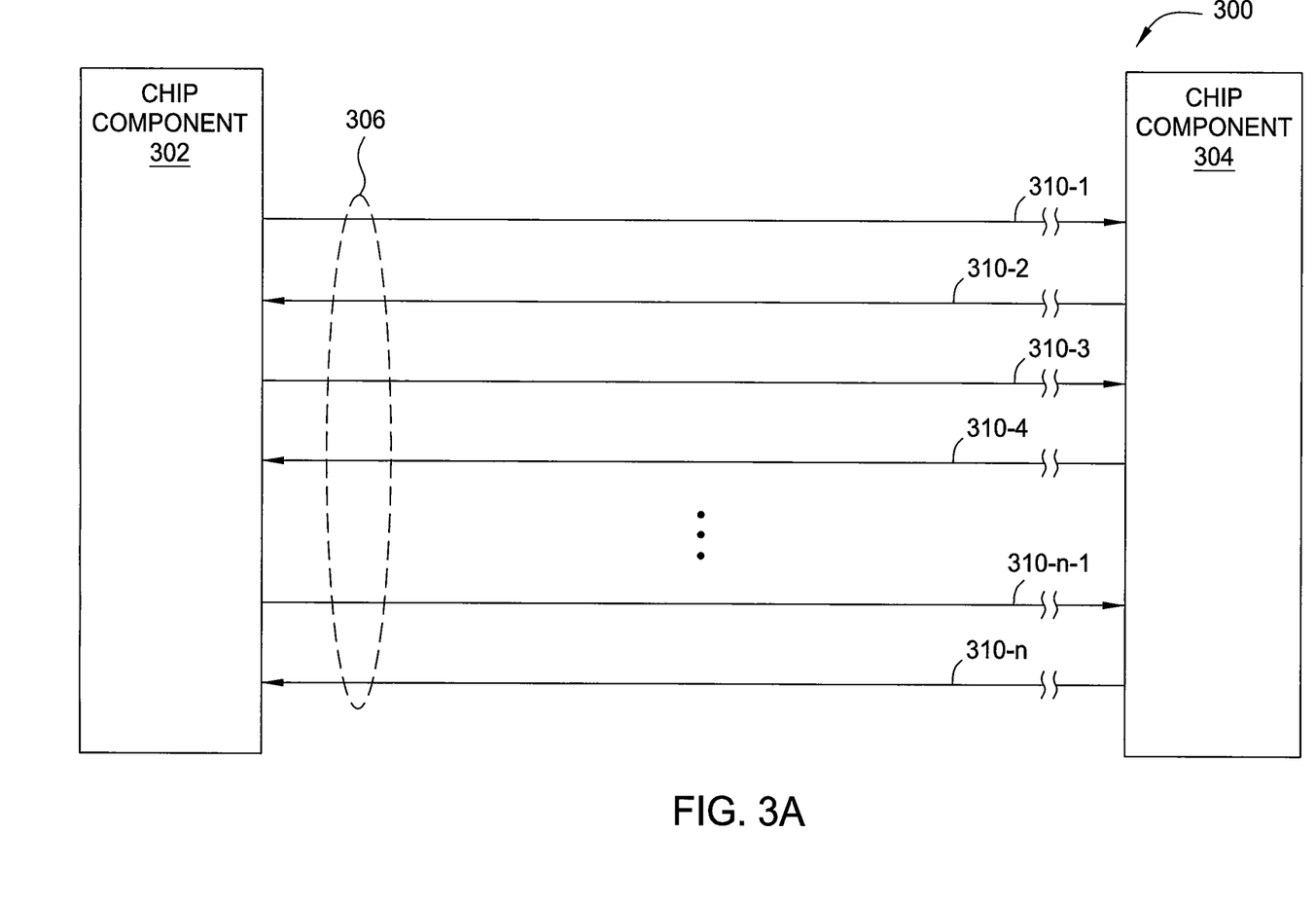
FIG. 3A-3D are conceptual diagrams that each illustrates an embodiment of a contraflow interconnect.

FIG. 3A is a conceptual diagram that illustrates a computer system 300 including chip components 302 and 304 coupled by a contraflow interconnect 306. Chip components 302 and 304 may be any two components that reside on a single chip such as CPU 102 or PPU 202, as discussed above in conjunction with FIGS. 1 and 2. Chip components 302 and 304 are configured to communicate with one another across contraflow interconnect 306.

As shown, contraflow interconnect 306 includes wires 310 that connect chip component 302 to chip component 304, or, alternatively, that connect chip component 304 to chip component 302. Wires 310 may transport data, in the form of bits, as one or more data signals that traverse the wires 310. Wires 310 may also transport multiple different data signals that form an ensemble of data signals, where each data signal represents a different portion of data. Those skilled in the art will recognize that wires 310 may be replaced with any technically feasible data connection capable of transmitting data signals. Wires 310 connecting chip component 302 to chip component 304 may be referred to herein as "left-to-right" wires or LTR wires. LTR wires include wires 310-1, 310-3, and 310-($n$-1). In like fashion, wires 310 connecting chip component 304 to chip component 302 may be referred to herein as "right-to-left" wires or RTL wires. RTL wires include wires 310-2, 310-3, and 310-$n$.

In general, contraflow interconnect 306 includes both LTR wires and RTL wires that are interlaced so that each wire in a given set of wires (either LTR or RTL) transports data in the opposite direction of one or more neighboring wires in the other set of wires. For example, wire 310-3 transports data from left to right, i.e. from chip component 302 to chip component 304. As shown, wire 310-3 neighbors wires 310-2 and 310-4. Both of wires 310-2 and 310-4 transport data from right to left, i.e. from chip component 304 to chip component 302, in a "contraflow" direction relative to wire 310-3.

As discussed in greater detail below, the specific arrangement of the wires 310 within contraflow interconnect 306 advantageously reduces crosstalk between those wires 310, improving the efficiency with which data signals can be transported across contraflow interconnect 306. As also discussed below, various embodiments of contraflow interconnect 306 include additional components that may further reduce crosstalk between wires 310.

Figure 3B:
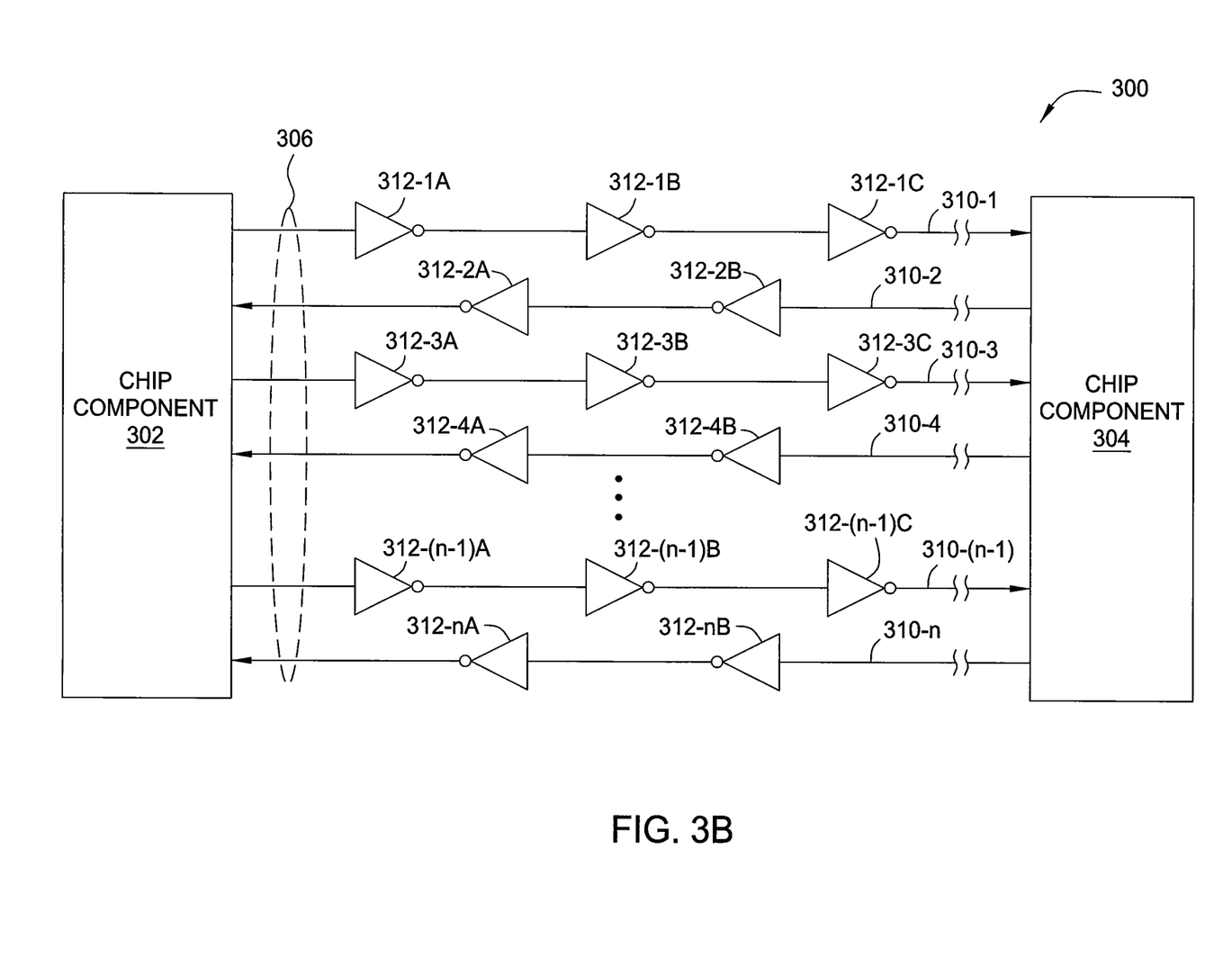

FIG. 3B is a conceptual diagram illustrating another embodiment of the contraflow interconnect 306 shown in FIG. 3A. As shown, FIG. 3B illustrates the computer system 300 that includes chip components 302 and 304 coupled by contraflow interconnect 306. As also shown, contraflow interconnect 306 includes repeaters 312 disposed along wires 310. Wire 310-1 includes repeaters 312-1A, 312-1B and 312-1C, wire 310-2 includes repeaters 312-2A and 312-2B, wire 310-3 includes repeater 312-3A, 312-3B, and 312-3C, wire 310-4 includes repeaters 312-4A and 312-4B, wire 312-($n$-1) includes repeaters 312-($n$-1)A, 312-($n$-1)B, and 312-($n$-1)C, and wire 310-$n$ includes repeaters 310-$n$A and 310-$n$B.

The repeaters 312 associated with a given wire 310 may be used to amplify a data signal transported across wire 310 by "repeating" that signal, thereby allowing the data signal to be transported across greater distances. In one embodiment, each of repeaters 312 may be implemented by an inverter. Repeaters 312 are generally disposed along a given wire 310 at regular intervals. In addition, a particular repeater 312 within a wire 310 is disposed along the wire 310 in order to maximize the distance between that repeater and one or more repeaters 310 associated with a neighboring "contraflow" wire. More specifically, a repeater 312 may be disposed along a wire 310 approximately halfway between the repeaters 312 associated with a neighboring contraflow wire. For example, as shown, repeater 312-1B is disposed along wire 310-1 approximately halfway between repeaters 312-2A and 312-2B associated with wire 310-2, which transports data in a contraflow direction relative to wire 310-1.

In practice, when contraflow interconnect 306 transports data as data signals across wires 310, the repeaters 312 of a given wire 310 repeat a data signal at regular intervals across the length of that wire. Repeaters 312 of neighboring wires 310 also repeat data signals at regular intervals. However, the repeaters 312 associated with the wire 310 are offset relative to the repeaters 312 of the neighboring contraflow wires, so that a data signal traversing the wire 310 may be repeated at a different location along that wire and at a different time compared to neighboring contraflow wires.

Including repeaters 312 at regular intervals that are offset from the intervals associated with repeaters 312 of neighboring contraflow wires may further improve the efficiency with which data signals can be transported across contraflow interconnect 306. The repeaters 312 also allow data signals to be transported across greater distances. In addition, each of the wires 310 may be coupled to a clock, thereby allowing the frequency and phase with which data signals traverse the contraflow interconnect 306 to be adjusted, as described in greater detail below in conjunction with FIG. 3C.

Figure 3C:
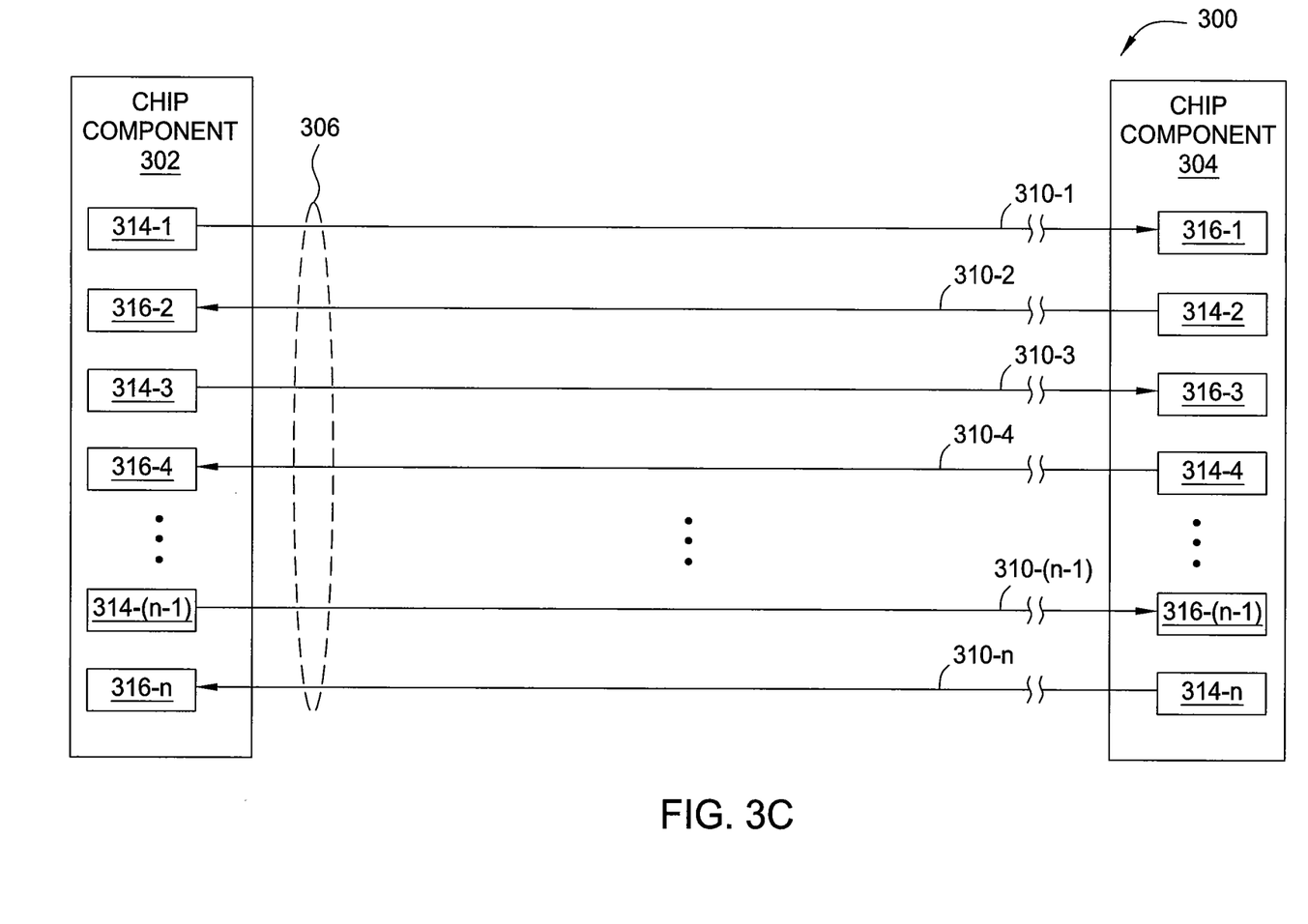

FIG. 3C is a conceptual diagram illustrating yet another embodiment of the contraflow interconnect 306 shown in FIGS. 3A and 3B. As shown, FIG. 3C illustrates the computer system 300 that includes chip components 302 and 304 coupled by contraflow interconnect 306. As also shown, each of wires 310 is coupled to a clock 314 and a sampling unit 316. Wire 310-1 is coupled to clock 314-1 and sampling unit 316-1, wire 310-2 is coupled to clock 314-2 and sampling unit 316-2, wire 310-3 is coupled to clock 314-3 and sampling unit 316-3, wire 310-4 is coupled to clock 314-4 and sampling unit 316-4, wire 310-($n$-1) is coupled to clock 314-($n$-1) and sampling unit 316-($n$-1), and wire 310-$n$ is coupled to clock 314-$n$ and sampling unit 316-$n$.

A given clock 314 emits a clock signal that determines the frequency and phase with which data signals are transmitted across the wire 310 coupled to that clock. In one embodiment, each of the LTR wires is coupled to one clock within chip component 302, while each of the RTL wires is coupled to one clock within chip component 304. In this embodiment, clock 314 associated with the LTR wires may have a particular frequency and phase relative to clock 314 associated with the RTL wires. In another embodiment, each of the clocks 314 is independently adjustable and may be configured with a particular phase and frequency.

A given sampling unit 316 coupled to a wire 310 samples data signals traversing the wire 310. In one embodiment, each of the LTR wires is coupled to one sampling unit 316 within chip component 304, while each of the RTL wires is coupled to one sampling unit 316 within chip component 302. In another embodiment, sampling units 316 are coupled to clocks 314 and sample data signals traversing wires 310 based on a received clock signal. For example, each sampling unit 316 may be an asynchronous first-in/first-out (FIFO) with an input port coupled to one of clocks 314. In yet another embodiment, each of the sampling units 316 includes an adjustable lag that determines a delay between a time when a clock signal is received and a time when a data signal is actually sampled.

In some situations, clocking data signals that traverse wires 310 and also clocking sampling units 316 coupled to those wires may mitigate different types of distortions that may occur to those data signals. For example, in a situation where a power supply coupled to contraflow interconnect 306 provides a variable and unpredictable voltage, the phase of data signals traversing contraflow interconnect 306 may become distorted, thereby corrupting the data represented by those data signals. In another exemplary situation, manufacturing variations within wires 310 may produce timing differences between those wires 310. When data signals are transmitted as an ensemble of different data signals across different wires 310, the phase and frequency of those data signals relative to one another may become distorted by the timing difference associated with the wires 310. Implementing the clocking and sampling techniques described above may overcome these, and other, sources of distortion.

As mentioned above, features of the various embodiments described in conjunction with FIGS. 3A-3C may be combined in any technically feasible fashion, as discussed in greater detail below in conjunction with FIG. 3D.

Figure 3D:
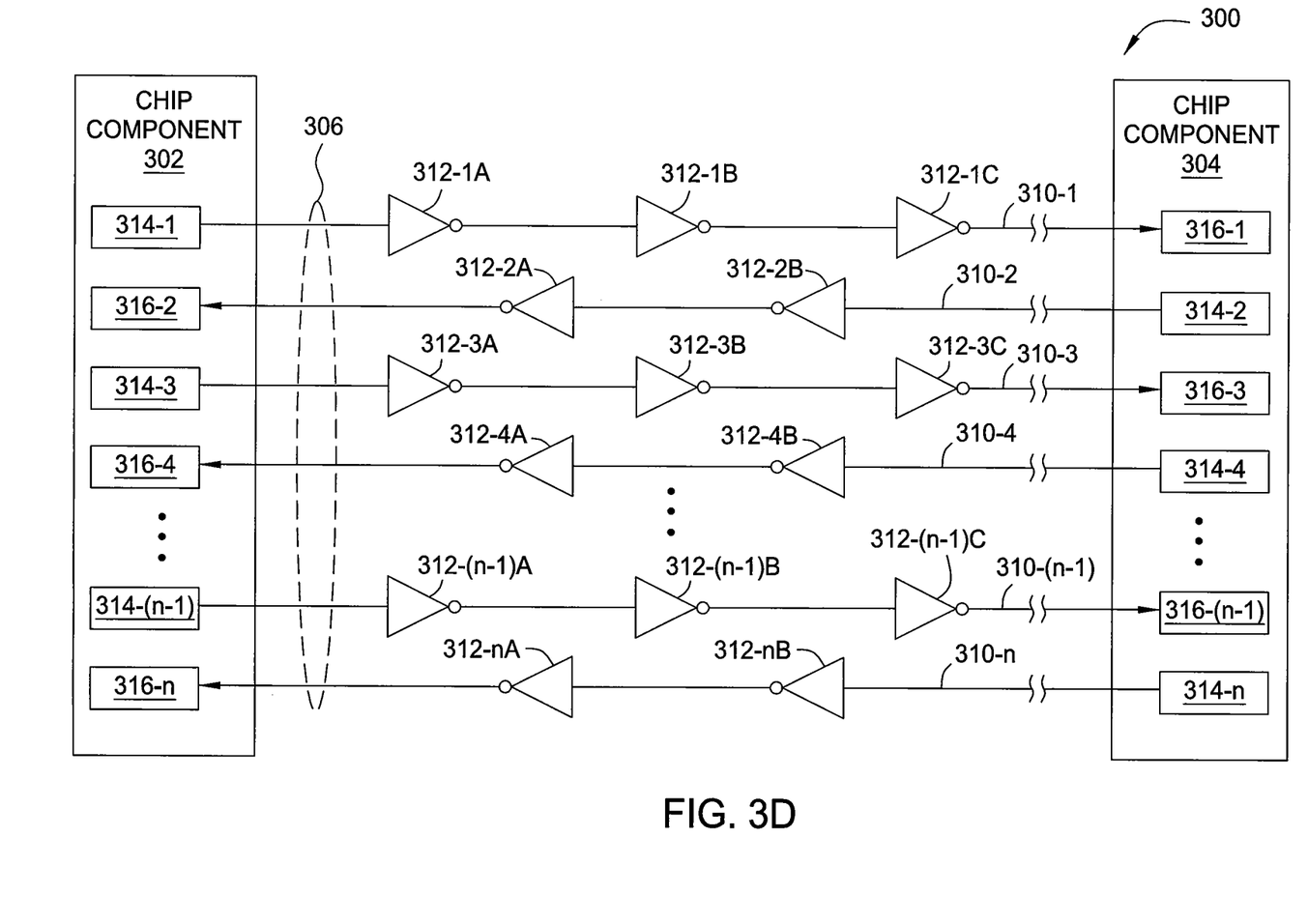

FIG. 3D is a conceptual diagram that illustrates yet another embodiment of contraflow interconnect 306. As shown, FIG. 3D illustrates the computer system 300 that includes chip components 302 and 304 coupled by contraflow interconnect 306. As also shown, each of wires 310 includes repeaters 312 disposed at regular intervals that are offset from repeaters 312 of neighboring contraflow wires. Additionally, each of the wires 310 is coupled between a clock 314 and a sampling unit 316. Contraflow interconnect 306 shown in FIG. 3D combines the different embodiments discussed above in conjunction with FIGS. 3A-3C and, additionally, combines the various advantages discussed in conjunction with those embodiments.

Persons skilled in the art will recognize that the conceptual diagrams discussed above in conjunction with FIGS. 3A-3D are presented for exemplary purposes only and should in no way limit the scope of the present invention. Those skilled in the art will also recognize that the approaches described herein are conceptual, and may be applied in any technically feasible fashion.

Figure 4:
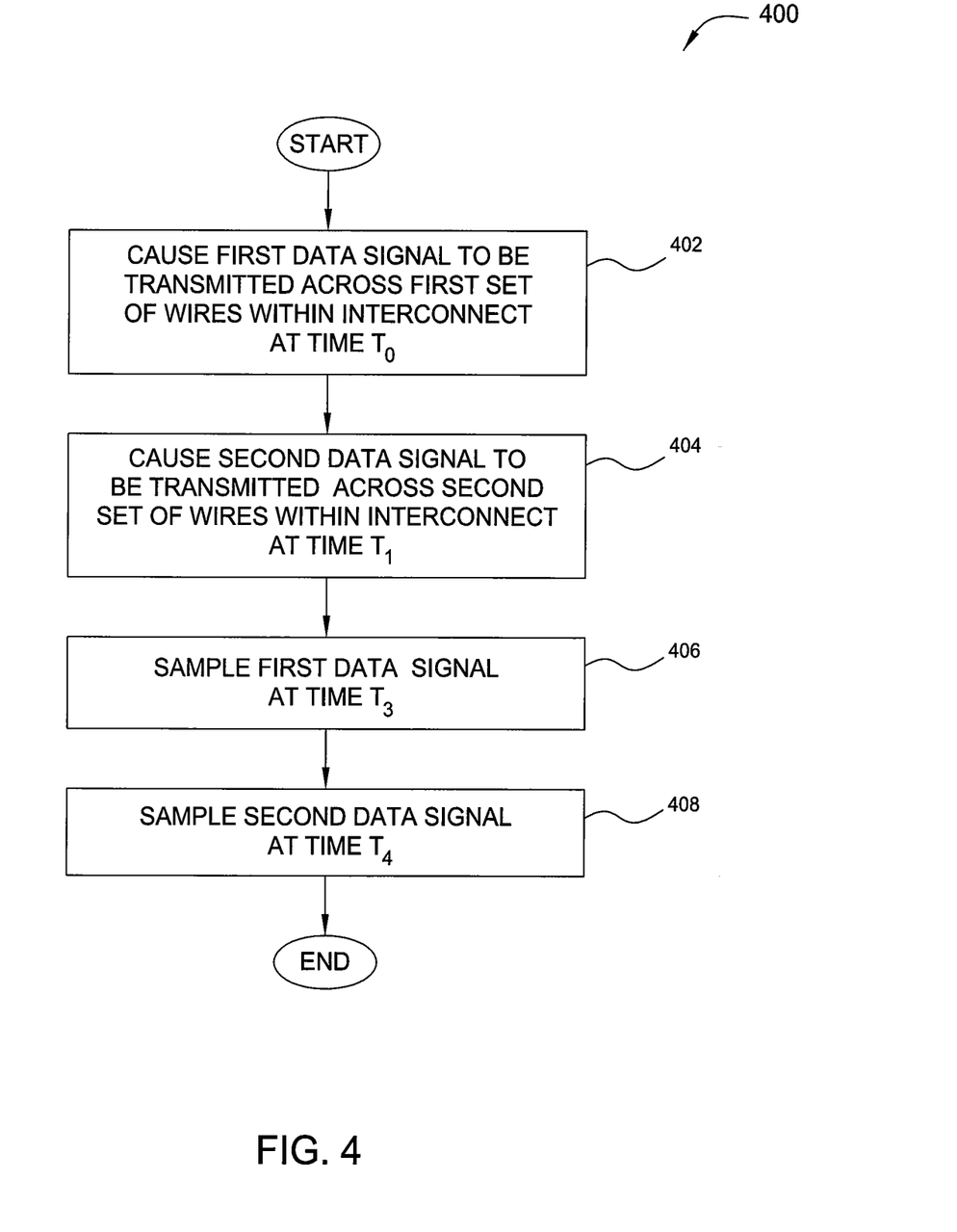
FIG. 4 is a flowchart of method steps for transporting data across a contraflow interconnect.

FIG. 4 is a flowchart of method steps for transporting data across a contraflow interconnect. Although the method 400 is described in conjunction with the systems of FIGS. 1, 2, 3A, 3B, and 3C, persons skilled in the art will understand that any system configured to perform the method steps, in any order, is within the scope of the inventions.

As shown, the method 400 begins at step 402, where the computer system 300 causes a first data signal to be transmitted across a first set of wires 310 within contraflow interconnect 306 at time t0. The first set of wires 310 may be, e.g., LTR wires. The first data signal transmitted across the first set of wires 310 may be an ensemble of bits traversing one or more different wires 310. The first set of wires 310 may transmit the first data signal based on a clock signal generated by a clock 314 coupled to the first set of wires 310.

At step 404, the computer system 300 causes a second data signal to be transmitted across a second set of wires 310 within contraflow interconnect 306 at time t1. The second set of wires 310 may be, e.g., RTL wires. The second data signal transmitted across the second set of wires 310 may be an ensemble of bits traversing one or more different wires 310. The second set of wires 310 may transmit the second data signal based on a clock signal generated by a clock 314 coupled to the second set of wires 310. In one embodiment, t0 is substantially similar to t1. In another embodiment, t0 is offset from t1 by a configurable amount.

At step 406, sampling unit 316 associated with the first set of wires 310 samples the first data signal at time t3. In one embodiment, sampling unit 316 samples data from the first set of wires based on a frequency and phase associated with the clock 314 coupled to the first set of wires 310.

At step 408, sampling unit 316 associated with the second set of wires 310 samples the second data signal at time t4. In one embodiment, sampling unit 316 samples data from the second set of wires based on a frequency and phase associated with the clock 314 coupled to the second set of wires 310. In one embodiment, t3 is substantially similar to t4. In another embodiment, t3 is offset from t4 by a configurable amount.

By implementing the method 400, data signals can be transported between chip components 302 and 304 across contraflow interconnect 306 with increased efficiency and throughput.

In sum, a contraflow interconnect is configured to couple together chip components within a computer system. The contraflow interconnect includes first and second sets of wires that transport data in opposite directions between first and second chip components. The first set of wires transports data signals from the first component to the second component, while the second set of wires transports data signals from the second component to the first component. The first set of wires is interlaced with the second set of wires so that each wire in the contraflow interconnect transports data in the opposite direction of one or more neighboring wires.

In one embodiment of the contraflow interconnect, each wire includes repeaters spaced at regular intervals. The repeaters associated with a given wire are disposed approximately halfway between the repeaters associated with neighboring wires. In another embodiment, each wire in the contraflow interconnect is coupled to a clock that controls the frequency and phase with which data signals are transmitted across the contraflow interconnect. Each wire may also be coupled to a sampling unit that controls the frequency and phase with which data signals are sampled from the contraflow interconnect. The sampling unit associated with a given wire may sample data from that wire based on the clock also coupled to that wire. Further embodiments of the contraflow interconnect include various combinations of the features described above.

Advantageously, crosstalk between neighboring wires is minimized, thereby improving the throughput of data transmissions between chip components. The distance across which data can reliably be transmitted may also be increased. In addition, the use of shielding may be avoided, thereby minimizing the area consumed by the contraflow interconnect.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A system for transmitting data between components within an integrated circuit (IC), comprising:
   a first IC component coupled to a first set of data connections and configured to transmit a first data signal across the first set of data connections;

a second IC component coupled to a second set of data connections and configured to transmit a second data signal across the second set of data connections; and an interconnect that includes the first and second sets of data connections and is configured to transport the first data signal to the second IC component across the first set of data connections and transport the second data signal to the first IC component across the second set of data connections, wherein the first set of data connections is interlaced with the second set of data connections such that each data connection in the first and second sets of data connections transmits data signals in a direction opposite of a direction one or more adjacent data connections transmit data signals, and wherein the first set of data connections includes a first set of repeaters spaced at substantially regular intervals along the first set of data connections and configured to repeat the first data signal, the second set of data connections includes a second set of repeaters spaced at substantially regular intervals along the second set of data connections and configured to repeat the second data signal, and the first set of repeaters are offset from the second set of repeaters such that each repeater in the first set of repeaters resides approximately halfway in between two repeaters in the second set of repeaters.

2. The system of claim 1, wherein the first set of data connections is coupled to a first clock that is configured to control the frequency and phase of data signals transported by the first set of data connections, and wherein the second set of data connections is coupled to a second clock that is configured to control the frequency and phase of data signals transported by the second set of data connections.

3. The system of claim 2, wherein the first clock causes the first set of data connections to transport data signals with a first phase and frequency, the second clock causes the second set of data connections to transport data signals with a second phase and frequency, and wherein the first phase and frequency are different than the second phase and frequency.

4. The system of claim 3, wherein the first set of data connections is coupled to a first sampling unit that is configured to sample data signals transported by the first set of data connections, and wherein the second set of data connections is coupled to a second sampling unit that is configured to sample data signals transported by the second set of data connections.

5. The system of claim 4, wherein the first sampling unit samples data signals transported by the first set of data connections at the first phase and frequency, and the second sampling unit samples data transported by the second set of data connections at the second phase and frequency.

6. The system of claim 1, wherein the data connections within the first and second sets of data connections comprise unshielded wires.

7. A computer-implemented method for transmitting data between components within an integrated circuit (IC), the method comprising:

causing a first IC component coupled to a first set of data connections to transmit a first data signal across the first set of data connections at time t0;

causing a second IC component coupled to a second set of data connections to transmit a second data signal across the second set of data connections at time t1, wherein an interconnect that includes the first and second sets of data connections is configured to transport the first data signal to the second IC component across the first set of data connections and transport the second data signal to the first IC component across the second set of data connections, and wherein the first set of data connections is interlaced with the second set of data connections such that each data connection in the first and second sets of data connections transmits data signals in a direction opposite of a direction one or more adjacent data connections transmit data signals, and wherein the first set of data connections includes a first set of repeaters spaced at substantially regular intervals along the first set of data connections and configured to repeat the first data signal, the second set of data connections includes a second set of repeaters spaced at substantially regular intervals along the second set of data connections and configured to repeat the second data signal, and the first set of repeaters are offset from the second set of repeaters such that each repeater in the first set of repeaters resides approximately halfway in between two repeaters in the second set of repeaters.

8. The computer-implemented method of claim 7, wherein the first set of data connections is coupled to a first clock that is configured to cause the first signal to be transmitted across the first set of data connections at time t0, the second set of data connections is coupled to a second clock that is configured to cause the second data signal to be transmitted across the second set of data connections at time t1, and wherein time t1 is offset relative to time t0 by a first configurable amount of time.

9. The computer-implemented method of claim 8, wherein the first clock causes the first set of data connections to transport data signals with a first phase and frequency, the second clock causes the second set of data connections to transport data signals with a second phase and frequency, and wherein the first phase and frequency are different than the second phase and frequency.

10. The computer-implemented method of claim 9, wherein the first set of data connections is coupled to a first sampling unit and the second set of data connections is coupled to a second sampling unit, the method further comprising:

sampling the first data signal at a first time by operation of the first sampling unit; and sampling the second data signal at a second time by operation of the second sampling unit, wherein the second time is offset from the first time by a second configurable amount of time.

11. The computer-implemented method of claim 10, wherein the first sampling unit samples data signals transported by the first set of data connections at the first phase and frequency, and the second sampling unit samples data transported by the second set of data connections at the second phase and frequency.

12. The computer-implemented method of claim 7, wherein the data connections within the first and second sets of data connections comprise unshielded wires.

13. A computing device, comprising:

a subsystem configured to transmit data between components within an integrated circuit (IC), the subsystem including:

a first IC component coupled to a first set of data connections and configured to transmit a first data signal across the first set of data connections;

a second IC component coupled to a second set of data connections and configured to transmit a second data signal across the second set of data connections; and an interconnect that includes the first and second sets of data connections and is configured to transport the first data signal to the second IC component across the first set of data connections and transport the second data signal to the first IC component across the second set of data connections, wherein the first set of data connections is interlaced with the second set of data connections such that each data connection in the first and second sets of data connections transmits data signals in a direction opposite of a direction one or more adjacent data connections transmit data signals, and wherein the first set of data connections includes a first set of repeaters spaced at substantially regular intervals along the first set of data connections and configured to repeat the first data signal, the second set of data connections includes a second set of repeaters spaced at substantially regular intervals along the second set of data connections and configured to repeat the second data signal, and the first set of repeaters are offset from the second set of repeaters such that each repeater in the first set of repeaters resides approximately halfway in between two repeaters in the second set of repeaters.

14. The computing device of claim 13, wherein the first set of data connections is coupled to a first clock that is configured to control the frequency and phase of data signals transported by the first set of data connections, and wherein the second set of data connections is coupled to a second clock that is configured to control the frequency and phase of data signals transported by the second set of data connections.

15. The computing device of claim 14, wherein the first clock causes the first set of data connections to transport data signals with a first phase and frequency, the second clock causes the second set of data connections to transport data signals with a second phase and frequency, and wherein the first phase and frequency are different than the second phase and frequency.

16. The computing device of claim 15, wherein the first set of data connections is coupled to a first sampling unit that is configured to sample data signals transported by the first set of data connections at the first phase and frequency, and wherein the second set of data connections is coupled to a second sampling unit that is configured to sample data signals transported by the second set of data connections at the second phase and frequency.

17. The computing device of claim 13, wherein the data connections within the first and second sets of data connections comprise unshielded wires.

* * * * *